United States Patent
Furukawa et al.

(10) Patent No.: US 8,841,928 B2
(45) Date of Patent: Sep. 23, 2014

(54) ORGANIC EL PANEL INSPECTION METHOD, ORGANIC EL PANEL INSPECTION DEVICE, AND ORGANIC EL PANEL

(75) Inventors: Keiichi Furukawa, Hachioji (JP); Kuniaki Uezawa, Ome (JP); Toshiyuki Kinoshita, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 498 days.

(21) Appl. No.: 13/322,024

(22) PCT Filed: May 11, 2010

(86) PCT No.: PCT/JP2010/057943
§ 371 (c)(1),
(2), (4) Date: Nov. 22, 2011

(87) PCT Pub. No.: WO2010/137452
PCT Pub. Date: Dec. 2, 2010

(65) Prior Publication Data
US 2012/0062236 A1    Mar. 15, 2012

(30) Foreign Application Priority Data

May 28, 2009   (JP) .................................. 2009-128622

(51) Int. Cl.
 G01R 27/26  (2006.01)
 G09G 3/00  (2006.01)
(52) U.S. Cl.
 CPC ...................................... G09G 3/006 (2013.01)
 USPC .......................... 324/692; 324/693; 324/71.1
(58) Field of Classification Search
 USPC .......................... 324/692, 693, 71.1, 714, 715
 See application file for complete search history.

(56) References Cited

U.S. PATENT DOCUMENTS

| 6,777,249 B2 | 8/2004 | Yamazaki |
| 2002/0042152 A1 | 4/2002 | Yamazaki et al. |

(Continued)

FOREIGN PATENT DOCUMENTS

| EP | 1 198 017 A2 | 4/2002 |
| JP | 4-14794 A | 1/1992 |

(Continued)

OTHER PUBLICATIONS

International Search Report dated Aug. 3, 2010 issued in International Appln. No. PCT/JP2010/057943.

(Continued)

*Primary Examiner* — Vincent Q Nguyen
(74) *Attorney, Agent, or Firm* — Holtz Holtz Goodman & Chick PC

(57) ABSTRACT

In an organic EL panel inspection method, to determine whether an organic EL panel is good or bad, a plurality of voltages having different values are sequentially applied to the organic EL panel, thereby measuring the respective currents. According to the currents, the following three criteria are checked: criterion (1), whether or not a spike current is present in the measured currents, criterion (2), between when the plurality of voltages are sequentially applied from one direction to the other direction of the voltage and when the plurality of voltages are sequentially applied from the other direction to the one direction, whether or not currents having different current densities occur at the same voltage, and criterion (3), the absolute value of the current density of current flowing when a predetermined voltage in the reverse direction is applied to the organic EL panel.

19 Claims, 6 Drawing Sheets

(56) References Cited

U.S. PATENT DOCUMENTS

| | | |
|---|---|---|
| 2002/0181276 A1 | 12/2002 | Yamazaki |
| 2004/0099862 A1* | 5/2004 | Suzuki et al. .................. 257/40 |
| 2004/0160167 A1 | 8/2004 | Arai et al. |
| 2006/0183254 A1 | 8/2006 | Yamazaki et al. |
| 2007/0166843 A1 | 7/2007 | Yamazaki |
| 2007/0257607 A1 | 11/2007 | Arai et al. |

FOREIGN PATENT DOCUMENTS

| | | |
|---|---|---|
| JP | 2003-51384 A | 2/2003 |
| JP | 3428603 B2 | 5/2003 |
| JP | 2003-282253 A | 10/2003 |
| JP | 2004-31335 A | 1/2004 |
| JP | 2009-037751 A | 2/2009 |
| JP | 2009-181049 A | 8/2009 |

OTHER PUBLICATIONS

Extended European Search Report (EESR) dated Nov. 2, 2012 (in English) issued in counterpart European Application No. 10780408.0.

* cited by examiner

ORGANIC EL PANEL INSPECTION METHOD, ORGANIC EL PANEL INSPECTION DEVICE, AND ORGANIC EL PANEL

This application is a U.S. National Phase Application under 35 USC 371 of International Application PCT/JP2010/057943 filed May 11, 2010.

TECHNICAL FIELD

The present invention relates to an organic EL panel inspection method used for inspecting the failure of an organic EL panel, an organic EL panel inspection device, and an organic EL panel inspected by using the above organic EL panel inspection method.

BACKGROUND TECHNOLOGY

In recent years, the need for a surface light-emitting element with low power-consumption and small volume has been growing, and an organic electroluminescent element (hereinafter referred to as an organic EL element) as one of such the surface light-emitting element has been attracting attention.

The organic EL element is made so that it injects electrons and holes from an electron injecting electrode and a hole injecting electrode respectively into a light emitting layer, recombines in the light emitting layer the electrons and holes injected in such a way, raises an organic material to an excited state, and then the organic material emits light when the material returns from the excited state to the ground state, and has a feature that the element can be driven with a low voltage. Further, it is expected that the element will be developed as a thin and flexible lighting application by taking advantage of the surface light emission characteristic.

Hereinafter, the light emitting body structured by using the above organic EL element is referred to as an organic EL panel.

As a failure of the organic EL element, there has been known a failure which is originated from production of the organic EL element and can not be recognized in an initial state but becomes obvious with lighting time of the organic EL panel, and the light emission suddenly stops. The failure (a defect) incurs a sudden stop of the light emission of the organic EL panel, and, in particular, when the organic EL panel is used for lighting, the failure leads to a sudden stop of the light emission, whereby it has become a problem such as an adverse effect on safety environment.

Hereinafter, the sudden stop of the light emission of the organic EL panel is also referred to as a sudden death of the organic EL panel.

On the above problem, there has been disclosed an inspection device in which a reverse pulse voltage having a predetermined voltage and a predetermined pulse width, which becomes a reverse bias condition to an organic EL element, is applied to the organic EL element, and then, an image of the organic EL element, which is in a state that the above reverse pulse voltage is applied, is taken in a light shielding state by an image taking means, and subsequently the number of light emitting points exhibiting higher brightness than the predetermined one is counted using an image inspection means, whereby the organic EL element is judged to be superior or inferior (refer, for example, to Patent Document 1).

PRIOR ARTS

Patent Document

Patent Document 1: Japanese Patent Application Publication No. 2008-21441

SUMMARY OF THE INVENTION

Problem to be Solved by the Invention

Patent Document 1 is to find a potential failure by an inspection of the organic EL element by taking an image using an image taking means utilizing a phenomenon that, when a reverse pulse voltage is applied to an organic EL element, light emission is observed at a failure part of the organic EL element having a failure.

However, since the inspection device requires an image taking means or the like, the structure thereof tends to be complicated and become larger.

The present invention has been achieved in consideration of the above circumstances, and it is an object of the invention to provide an organic EL panel inspection method by which an organic EL panel which tends to be easily brought into a sudden stop of the light emission (a sudden death) can be easily sorted with a simple method and configuration, and to also provide an organic EL panel inspection device for carrying out an inspection using the above organic EL panel inspection method.

Measures to Solve the Issues

The above object can be achieved by the method and configuration described below.

Item 1. An organic EL panel inspection method which inspects whether the organic EL panel provided with an organic EL element is superior or inferior, wherein the method comprises a step in which a plurality of voltages having different values are successively applied to the above organic EL panel, and then each electric current is measured, and a step in which the above organic EL panel is judged to be superior or inferior based on the above measured electric current, and the above judgment whether the organic EL panel is superior or inferior is carried out based on at least one of judgment references of the following judgment references 1 to 3: judgment reference 1 is defined as the presence or absence of a spike-like electric current in the above measured current; judgment reference 2 is defined as the presence or absence of generation of electric current having different current density at an identical voltage between when the above plurality of voltages are successively applied from one end of the above plurality of voltages to the other end and when the above plurality of voltages are successively applied from the above other end to the above one end; and judgment reference 3 is defined as an absolute value of the current density of the electric current flowed when the predetermined voltage is applied to the above organic EL panel in the reverse direction.

Item 2. The organic EL panel inspection method described in the above Item 1, wherein the above plurality of voltages change in step-wise at an interval of voltage of 0.5 volts or less.

Item 3. The organic EL panel inspection method described in the above Item 1 or 2, wherein at least one of the above plurality of voltages is a voltage near a portion where the electric current rises in the voltage-current characteristic curve in the forward direction of the above organic EL panel.

Item 4. The organic EL panel inspection method described in any one of the above Items 1 to 3, wherein the range of the above voltage to be applied is represented by the entire or a part of the range of +n×E(V) to −n×E(V), when the number of plurality of light emitting units in which the above organic EL panels are laminated is represented by n units, wherein, E(V)=light emission initiation voltage of an organic EL panel (V) +2.0 (V), and the light emission initiation voltage of the above organic EL panel is a voltage when the number of the light emission unit is one.

Item 5. The organic EL panel inspection method described in any one of the above Items 1 to 4, wherein, in the above judgment reference 1, when the magnitude of the current density of the above spike-like electric current is less than the predetermined current density, the above spike-like electric current is judged to be absent, and thereby the above organic EL panel is judged to be superior, and when the magnitude of the current density of the above spike-like electric current is more than or equal to the predetermined current density, the above spike-like electric current is judged to be present, and thereby the above organic EL panel is judged to be inferior.

Item 6. The organic EL panel inspection method described in any one of the above items 1 to 5, wherein, in the above judgment reference 1, when the voltage range of the applied voltage in which the above spike-like current was generated is −E+0.5(V) or more and −1.0 V or less, or +0.1 V or more and E−0.5(V) or less, the above organic EL panel is judged to be inferior, wherein, E(V)=light emission initiation voltage of an organic EL panel (V)+2.0 (V).

Item 7. The organic EL panel inspection method described in any one of the above Items 1 to 4, wherein, in the above judgment reference 2, when the difference of the current densities at an identical voltage is less than the predetermined value, the above organic EL panel is judged to be superior, and when the difference of the current densities at an identical voltage is higher than or equal to the predetermined value, the above organic EL panel is judged to be inferior.

Item 8. The organic EL panel inspection method described in any one of the above Items 1 to 4, wherein, in the above judgment reference 3, when the absolute value of the current density of the above electric current is less than the predetermined absolute value, the above organic EL panel is judged to be superior, and when the absolute value of the current density of the above electric current is higher than or equal to the predetermined absolute value, the above organic EL panel is judged to be inferior.

Item 9. The organic EL panel inspection method described in any one of the above Items 1 to 8, wherein the number of repeated application of the above plurality of voltages is three or more.

Item 10. The organic EL panel inspection device which inspects whether the organic EL panel provided with an organic EL element is superior or inferior, wherein the method is comprised of a voltage application means in which a plurality of different voltages are successively applied to the above organic EL panel, an electric current measuring means in which each electric current at the above plurality of voltages is measured, and means in which the above organic EL panel is judged to be superior or inferior based on the above measured electric current, and the above judgment whether the organic EL panel is superior or inferior is carried out based on at least one of judgment references of the following judgment references 1 to 3: judgment reference 1 is defined as the presence or absence of a spike-like electric current in the above measured electric current; judgment reference 2 is defined as the presence or absence of generation of electric current having different current density with an identical voltage between when the above plurality of voltages are successively applied from one end of the above plurality of voltages to the other end and when the above plurality of voltages are successively applied from the above other end to the above one end; and judgment reference 3 is defined as an absolute value of the current density of the electric current flowed when the predetermined voltage is applied to the above organic EL panel in the reverse direction.

Item 11. The organic EL panel inspection device described in the above Item 10, wherein the above plurality of voltages change in step-wise at an interval of voltage of 0.5 volts or less.

Item 12. The organic EL panel inspection device described in the above Item 10 or 11, wherein at least one of the above plurality of voltages is a voltage near a portion when the electric current rises in a voltage-current characteristic curve in the forward direction of the above organic EL panel.

Item 13. The organic EL panel inspection device described in any one of the above Items 10 to 13, wherein the range of the above voltage to be applied is represented by the entire or a part of range of +n×E(V) to −n×E(V), when the number of plurality of light emitting units in which the above organic EL panels are laminated is represented by n units, wherein, E(V)=light emission initiation voltage of an organic EL panel (V) +2.0 (V), and the light emission initiation voltage of the above organic EL panel is a voltage when the number of light emission unit is one.

Item 14. The organic EL panel inspection device described in any one of the above Items 10 to 13, wherein, in the above judgment reference 1, when the magnitude of the current density of the above spike-like electric current is less than the predetermined current density, the above spike-like electric current is judged to be absent, and thereby the above organic EL panel is judged to be superior, and when the magnitude of the current density of the above spike-like electric current is more than or equal to the predetermined current density, the above spike-like electric current is judged to be present, and thereby the above organic EL panel is judged to be inferior.

Item 15. The organic EL panel inspection method described in any one of the above Items 10 to 14, wherein, in the above judgment reference 1, when the voltage range of the applied voltage in which the above spike-like current was generated is −E+0.5(V) or more and −1.0 V or less, or +0.1 V or more and E−0.5(V) or less, the above organic EL panel is judged to be inferior, wherein, E(V)=light emission initiation voltage of an organic EL panel (V)+2.0 (V).

Item 16. The organic EL panel inspection method described in any one of the above Items 10 to 13, wherein, in the above judgment reference 2, when the difference of the current densities at an identical voltage is less than the predetermined value, the above organic EL panel is judged to be superior, and when the difference of the current densities at an identical voltage is higher than or equal to the predetermined value, the above organic EL panel is judged to be inferior.

Item 17. The organic EL panel inspection method described in any one of the above Items 10 to 13, wherein, in the above judgment reference 3, when the absolute value of the current density of the above electric current is less than the predetermined absolute value, the above organic EL panel is judged to be superior, and when the absolute value of the current density of the above electric current is higher than or equal to the predetermined absolute value, the above organic EL panel is judged to be inferior.

Item 18. The organic EL panel inspection method described in any one of the above Items 10 to 17, wherein the number of repeated application of the above plurality of voltages is three or more.

Item 19. The organic EL panel, wherein the organic EL panel was inspected by the organic EL panel inspection method described in any one of the above Items 1 to 9.

Effects of the Invention

According to the above, by carrying out a judgment of an organic EL panel to be superior or inferior, based on at least one judgment reference of the above judgment references 1 to 3, it becomes possible to accurately sort the organic EL panel which is highly possible to cause a sudden stop of the light emission. Namely, the inspection whether the organic EL panel is superior or inferior can be effectively carried out with high accuracy.

MODE FOR CARRYING OUT THE INVENTION

With regard to the above problem that the failure becomes obvious with lighting time of the organic EL panel and the light emission suddenly stops, an inspection method to predict and distinguish in advance the failure of the organic EL panel was diligently studied by the inventors of the present invention. As a result, it was confirmed that when a voltage was applied to the organic EL panel and the voltage (V)—current (I) characteristic (hereinafter, it is also referred to as the V-I characteristic) was measured, if the characteristic does not show a clear (normal) diode characteristic, but contains a spike-like leakage current, a difference in current hysteresis, or leakage current, the organic EL panel is highly probable to cause a sudden stop of the light emission in a certain time period.

Therefore, the inventors learned that a potential failure point of the organic EL panel can be found in a short time by applying a voltage to the organic EL panel and measuring the V-I characteristic.

The embodiments of the present invention will be described below with reference to figures, but the invention is by no means limited to them.

Figure 1:
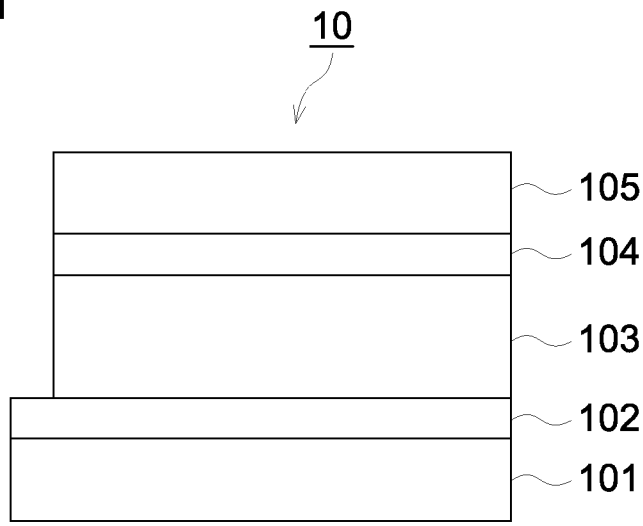
FIG. 1 is a figure showing an example of a basic unit structure of an organic EL panel with one light emitting unit.

FIG. 1 is a figure showing a basic unit structure of organic EL panel 10 provided with an organic EL element with one light emitting unit.

Support layer 101 is a flexible support layer composed of resin. Electrode layer 102 (the first electrode layer) is formed on support layer 101, organic EL light emitting layer 103 is formed on electrode layer 102, and electrode layer 104 (the second electrode layer) is formed on organic EL light emission layer 103. Number 105 represents a protective layer.

As organic EL light emission layer 103, usable are, in addition to an organic light emitting layer containing an organic light emitting material, layers having a positive hole injection layer, a positive hole transport layer, an electron block layer, a positive hole block layer, an electron transport layer and an electron injection layer.

Sheet light emitting body 10 has a single-sided light emitting type or a double-sided light emitting type. In the case of single-sided light emitting type, for example, support layer 101 and electrode layer 102 are formed transparent, and either electrode layer 104 or protective layer 105 is formed opaque. In the case of double-sided light emitting type, support layer 101, electrode layers 102 and 104, and protective layer 105 are formed transparent. Organic EL light emission layer 103 emits light when a voltage is applied between electrodes 102 and 104 and electric current flows.

Figure 2:
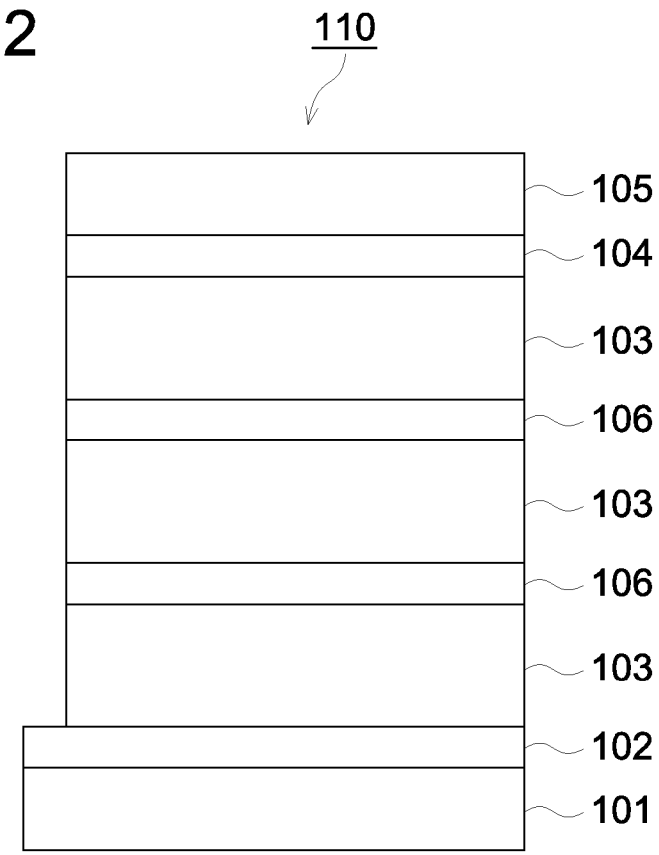
FIG. 2 is a figure showing an example of a basic unit structure of an organic EL panel with a plurality of light emitting units.

FIG. 2 is a figure showing a unit structure of multi-photon organic EL panel 110 provided with a multi-photon organic EL element (MPE) having a plurality of light emitting units. In FIG. 2, number 106 represents a charge generation layer. The example of FIG. 2 is the case when the number of the light emitting unit is three. Multi-photon organic EL panel 110 has characteristics that, in order to produce the same brightness, an electric current decreases to a fraction of a unit, and instead, a voltage requires several times of a unit compared to organic EL panel 10 with one unit.

Figure 3:
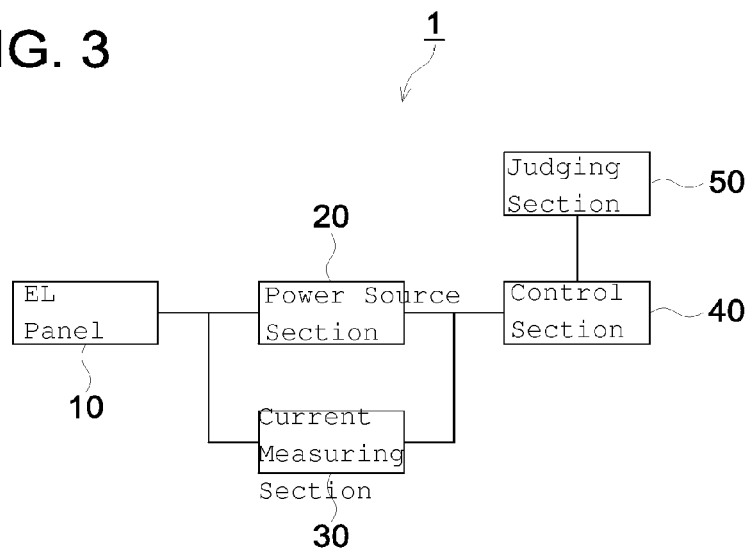
FIG. 3 is a block diagram showing an example of the organic EL panel inspection device relating to the present invention.

FIG. 3 is a block diagram showing an example of organic EL panel inspection device 1 in which an organic EL panel inspection method relating to the present invention is applied.

Organic EL panel inspection device 1 is provided with power source section 20, which is a voltage application means, current measuring section 30, which is a current measuring means, control section 40, and judging section 50, which is a judging means.

Power source section 20 successively applies a plurality of different voltages to organic EL panel 10, which is a test object. Current measuring section 30 measures each current at a plurality of voltages applied to organic EL panel 10. Control section 40 manages various data and signals as well as controlling power source section 20 and current measuring section 30. Judging section 50 judges whether organic EL panel 10 is superior or inferior based on the measured V-I characteristic with reference to the predetermined judgment reference.

Next, the inspection of organic EL panel 10 will be described.

First, organic EL panel 10, which is a test object, is placed on the predetermined position, for example, on an inspection bench (not illustrated).

Next, organic EL panel 10 is connected with power source section 20 and current measuring section 30.

Control section 40 controls a plurality of voltages which are applied by power source section 20 to organic EL panel 10, based on the application voltage range calculated in advance.

When the inspection bench is installed in a production line of organic EL panel 10 to facilitate online inspection, production efficiency can be improved.

A plurality of voltages to be applied are designed to be a voltage which changes in a step-wise fashion at regular voltage intervals within an application voltage range. This fixed voltage interval is preferably 0.5 V or less in a certain period after the start of the production. If the voltage interval exceeds 0.5 V, the current measurement interval becomes longer, and, as a result, the inspection becomes difficult even if an abnormal current is caused at a voltage between measurements. Also, if the voltage interval is narrowed, the inspection accuracy of the abnormal current is improved, but the time required for the inspection becomes longer to result in lower productivity. For this reason, corresponding to the quality level of organic EL panel 10, the voltage interval is appropriately set to 0.5 V or less.

However, it is possible to review the voltage interval to improve the productivity by reducing the inspection time under a stable quality condition such as when the production quality of organic EL panel 10 is maintained for a certain period of time at a permissible level, and when the cause of failure is analyzed and an action is taken.

As described above, in the case where the V-I characteristic of organic EL panel 10 contains a spike-like leakage current, a difference in current hysteresis, or leakage current, the organic EL panel is highly probable to cause a sudden stop of the light emission, and therefore, the range for inspecting the V-I characteristic is required to cover a voltage range where organic EL panel 10 initiates light emission. For this reason, at least one of a plurality of application voltages is preferably a voltage near a portion where the electric current rises. Further, this neighborhood portion is preferably ±0.25 V of the voltage where the electric current rises.

The above application voltage range is, when the number of plurality of light emitting units in which organic EL panels 10 are laminated is represented by n, the entire or a part of range of +n×E(V) to −n×E(V). The value of E is set to E(V)=light emission initiation voltage of an organic EL panel (V)+2.0 (V), wherein the light emission initiation voltage of the organic EL panel in the formula is a voltage when the number of the light emission unit is one.

Since the voltage where the above described electric current rises can be assumed to be a voltage where the light emission initiates, the above application voltage range contains a voltage near a portion where the electric current rises.

The present embodiments are described under assumption that the number of the light emitting unit of organic EL panel 10 is one, the application voltage range is −3.5 V to +3.5 V, and the voltage interval is 0.25 V.

Figure 4:
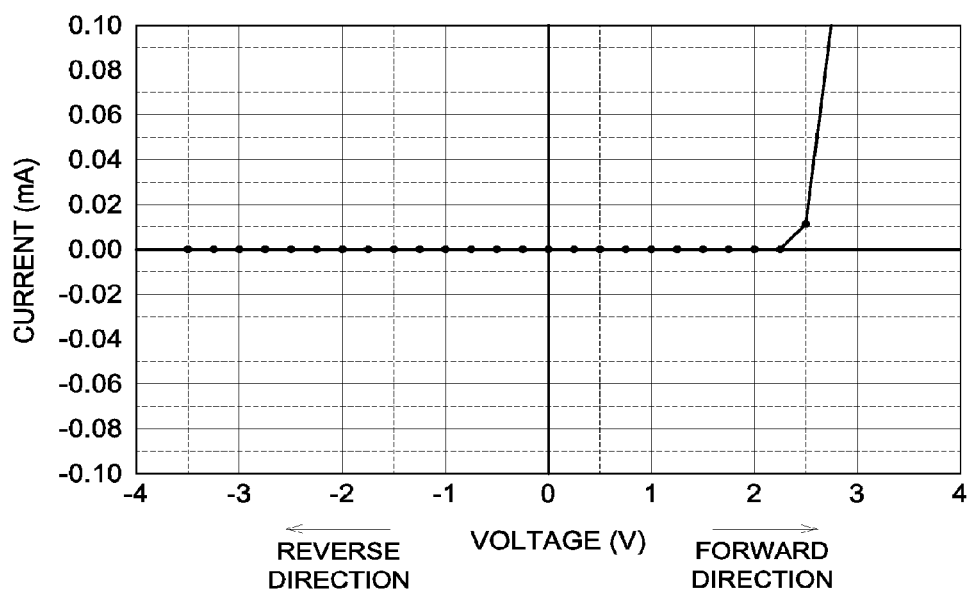
FIG. 4 is a graph showing an example of V-I characteristic when a voltage is applied to an organic EL panel.
Figure 5:
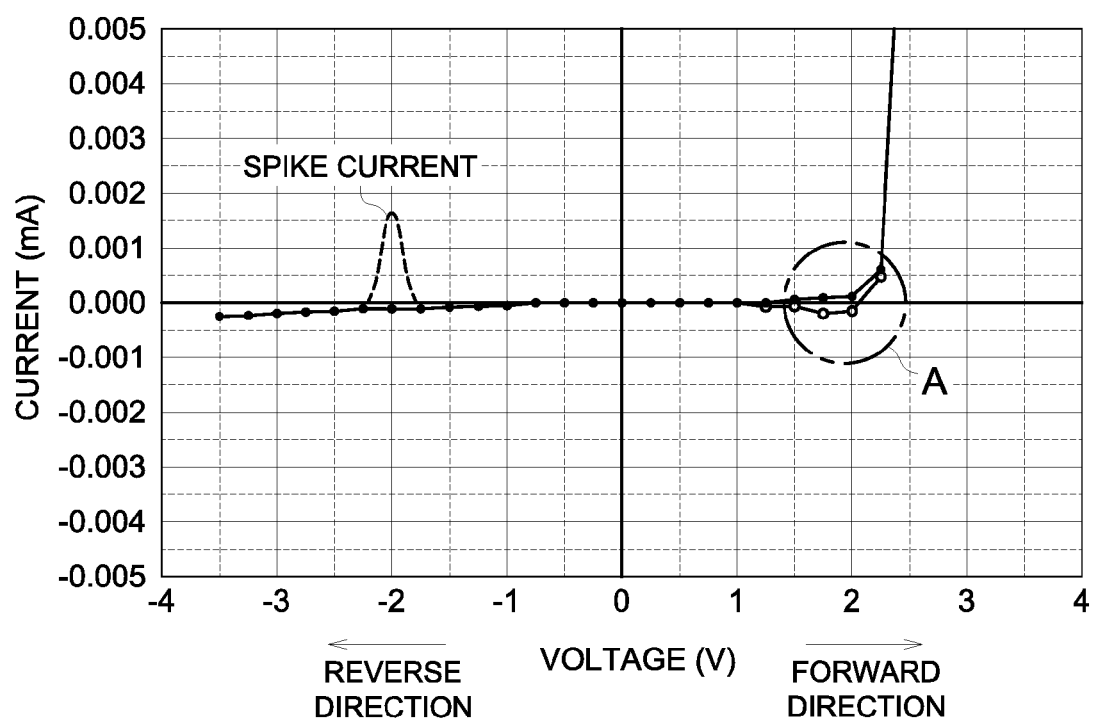
FIG. 5 is a highly defined graph of the graph in FIG. 4.

FIG. 4 is a graph representing an example of the V-I characteristic when a voltage is applied to organic EL panel 10. Hereinafter, FIG. 4 is also referred to as a medium-definition graph. FIG. 5 is a graph representing the electric current portion of FIG. 4 with further definition. Hereinafter, FIG. 5 is also referred to as a high-definition graph.

In FIGS. 4 and 5, since organic EL panel 10 emits light when a current flows at a positive voltage, the positive voltage direction indicates a forward direction and the negative voltage direction indicates a reverse direction.

Next, a voltage is applied to organic EL panel 10 by power source section 20. Beginning at 0 volt, the voltage is first applied in a step-wise fashion at a 0.25 V interval in a reverse direction, that is, in the direction of −3.5 V. During applying the voltages, the voltages are made off and the circuit is made open.

When the voltage is applied until −3.5 V, the voltage application is similarly carried out returning again in the direction of 0 volt. Next, the voltage application is similarly carried out in the forward direction, that is, in the direction of 3.5 V. When the voltage is applied until 3.5 V, the voltage application is similarly carried out returning again in the direction of 0 volt. In this way, the voltage application is carried out in the direction of the order of 0→−3.5→0→3.5→0 (V). This series of voltage application represents one time. The number of the voltage application is preferably at least three times in order to avoid noise, an error in measurement, or the like to secure accuracy in measurement.

When the voltage is applied, each current is measured by current measuring section 30, and the measured data are sent to control section 40. Control section 40 creates, based on the measured data, a relation table between the applied voltage and the measured current (the V-I characteristic table). Also, the V-I characteristic graph is created. These are sent to judging section 50.

FIGS. 4 and 5 are graphs which were made by measuring each current generated at each voltage applied in such a manner. In the medium-definition graph (FIG. 4), the difference in an electric current at the identical voltage is unable to be confirmed visually, but in the high-definition graph (FIG. 5), it is possible to confirm visually the generation of difference in an electric current at the identical voltage in portion A of the figure. The broken line in the high-definition graph is an example of a spike current.

Judging section 50 judges whether organic EL panel 10 is superior or inferior based on the V-I characteristic with reference to the V-I characteristic table and the V-I characteristic graph. The judgment whether organic EL panel 10 is superior or inferior is carried out based on at least one judgment reference of three judgment references to be hereinafter described.

In the present embodiments, the judgment is carried out using three judgment references to be hereinafter described.

In judgment reference 1, the presence or absence of a spike-like electric current (a spike current) in the above measured current is the judgment reference. If a current flows in the portion where originally no current flows even if a voltage is applied in the V-I characteristic of a diode, the diode is assumed to have a fault, and therefore, the presence or absence of a spike current can be used as a judgment reference.

However, in the case where, even if the spike current is generated, the spike current does not influence a lifetime because of the generated spike current being slight or the like, the spike current can be considered to be absent For this reason, the predetermined current density is set as a threshold of the spike current, and when the current density of the spike current is less than the threshold (the predetermined current density), organic EL panel 10 is judged to be superior assuming the spike current being absent, and when the current density is more than or equal to the threshold (the predetermined current density), organic EL panel 10 is judged to be inferior assuming the spike current being present.

The threshold of the current density, in which a judgment whether organic EL panel 10 is superior or inferior is carried out, is appropriately set by experiments or the like based on product specification of organic EL panel 10, characteristics of the diode, or the like. Provided that the threshold is X (A/m$^2$), X is preferably in the range of 0.00005<X<0.005.

For example, when the current density of the spike current is less than 0.0005 A/m2 with the current density of 0.0005 A/m$^2$ being assumed as the threshold with the light emission area being converted to m$^2$, it is judged to be superior, and when it is more than or equal to 0.0005 A, it is judged to be superior, and when it is more than or equal to 0.0005 A/m2, it is judged to be inferior.

In this case, the voltage range in which the presence or absence of the generation of the spike current is judged can also be made to be a specific voltage range.

In the case of a reverse direction, when the application voltage is more than or equal to −1 V, the spike current is hard to be generated since the absolute value of the application voltage is small. Further, since, when the absolute value of the application voltage becomes large (the voltage becomes small), the voltage comes closer to a yield point, the increase in an electrical current does not necessarily mean the spike current because an increase in an electrical current may occur besides the generation of the spike current.

Similarly in the case of a forward direction, when the application voltage is less than or equal to 1 V, the spike current is hard to be generated since the absolute value of the application voltage is small. Further, since, when the absolute value of the application voltage becomes large (the voltage becomes large), the voltage comes closer to a light emission initiation point, the increase in an electrical current can not be judged to be the spike current.

The specific voltage range can be set to be (−E+0.5)V or more and −1.0 V or less, or +1.0 V or more and (E−0.5)V or less. With these values, the efficiency of an inspection of presence or absence of a spike current can be improved.

In the case where more accuracy is required in the above inspection, the inspection is preferably carried out with a shorter interval of the application voltage. Hereinafter, the above-described inspection of the spike current is referred to as a spike inspection, and the inspection with higher accuracy is referred to as a high accuracy spike inspection. Further, in the case where the both spike inspection and high accuracy inspection are carried out, the judgments with the spike inspection and with the high accuracy inspection are referred to as judgment references 1-1 and 1-2 respectively.

The high accuracy inspection is carried out in accordance with the spike inspection with the voltage interval of the application voltage being, for example, set to 0.005 V. The high accuracy spike inspection requires more inspection time than that of the spike inspection, since the voltage interval of the application voltage is set to 0.005 V. For this reason, the high accuracy spike inspection is preferably carried out after the spike inspection separately from the spike inspection in relation to inspections relating to judgment references 2 and 3 to be hereinafter described. In addition, since it takes a lot of inspection time as described above, the inspection range may be limited to a portion where no current flows even if a voltage is originally applied in the V-I characteristic of a diode, namely, in the reverse direction (in the range of the application voltage of 0→−3.5→0).

Here, examples of a case where judgment references 1-1 and 1-2 are carried out in the inspection will be described.

First of all, the range in which the judgment is made to be superior is widened by enlarging the threshold in judgment reference 1-1, for example, to 0.001 A/m². Based on the total of the above judgment and the judgment at the inspection relating to judgment references 2 and 3 to be hereinafter described, the primary sorting of organic EL panel 10 whether it is superior or inferior is carried out, and further, a detailed judgment is carried out in judgment reference 1-2, whereby secondary sorting is carried out. With the above sorting, judgment references 1-1, 2 and 3 can be carried out in almost parallel fashion, and thereby, a judgment with a higher accuracy can be effectively carried out.

Judgment reference 2 is defined as the presence or absence of generation of electric current having different current density at an identical voltage between when the plurality of voltages are successively applied from one end of the above plurality of voltages to the other end and when the above plurality of voltages are successively applied from the above the other end to the above one end. Namely, whether or not a different portion (a difference) is generated in the electric current hysteresis when, similarly to the above, a voltage is applied successively in a manner of 0→−3.5→0→3.5→0 (V).

In judgment reference 2, the difference in the predetermined current densities at an identical voltage is set as a threshold, and when the difference of the current densities at an identical voltage is less than the threshold (the predetermined current density difference), organic EL panel 10 is judged to be superior, and when the difference of the current densities at an identical voltage is higher than or equal to the threshold (the predetermined current density difference), organic EL panel 10 is judged to be inferior.

The fact that the difference occurs in the electric current hysteresis means that current variation occurs when the identical voltage is applied, and if the difference in current densities becomes larger than a threshold, the variation in the hysteresis becomes larger, which means that organic EL panel 10 is unstable.

The above threshold of difference in current hysteresis, in which a judgment whether organic EL panel 10 is superior or inferior is carried out, is appropriately set by experiments or the like based on product specification of organic EL panel 10, characteristics of the diode, or the like. For example, in the case where the threshold is set to 0.001 A/m², the current density difference of 0.001 A/m² or more means that the variation in the hysteresis is large, which means that organic EL panel 10 is unstable.

In judgment reference 2, in the case where the threshold is set to 0.001 A/m², organic EL panel 10 is judged to be superior if the current density difference at an identical voltage is less than 0.001 A/m², and is judged to be inferior if the current density difference at an identical voltage is 0.001 A/m² or more.

Judgment reference 3 is defined by an absolute value of the current density of the electric current flowed at the predetermined voltage when a voltage is applied to organic EL panel 10 in a reverse direction, wherein the predetermined voltage means a voltage in which the absolute value is maximum (the voltage is minimum) at the reverse application voltage.

In judgment reference 3, the absolute value of the predetermined current density at the predetermined voltage is set as a threshold, and the absolute value of the current density at the predetermined voltage.
is less than the threshold (the absolute value of the predetermined current density), organic EL panel 10 is judged to be superior, and when the absolute value of the current density is higher than or equal to the threshold (the absolute value of the predetermined current density), organic EL panel 10 is judged to be inferior.

In the V-I characteristics of a diode, the fact that a large current flows in a portion in the reverse direction when originally no current flows even if a voltage is applied means large leakage current, which means a fault of a diode.

The above threshold, in which a judgment whether organic EL panel 10 is superior or inferior is carried out, is appropriately set by experiments or the like based on product specification of organic EL panel 10, characteristics of the diode, or the like. Provided that the threshold is defined as Y (A/m²), Y is preferably in the range of $0.0002(A/m^2) < Y < 0.02(A/m^2)$.

For example, in the case where the threshold is set to 0.004 A/m², organic EL panel 10 is judged to be superior if the absolute value of the current density at a time when a voltage is applied is less than 0.004 A/m², and is judged to be inferior if it is 0.004 A/m² or more, with the predetermined voltage being −3.5 V.

The voltage application method is not limited to the above. FIG. 6 is a typical figure showing a part of various voltage application methods.

Figure 6A:
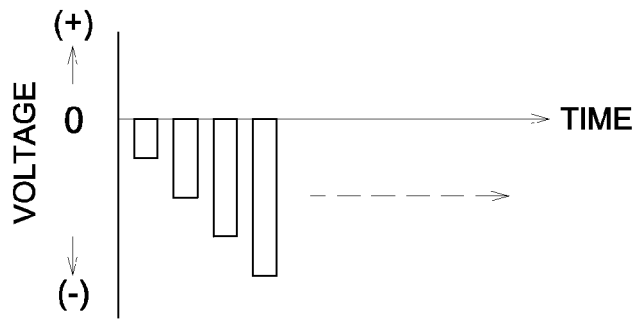
FIG. 6 is a figure showing various voltage application methods.

FIG. 6a is a figure showing the foregoing voltage application method used in the present embodiment. Beginning at 0 volt, the voltage is lint applied in a step-wise fashion at a 0.25 V interval in a reverse direction, that is, in the direction of −3.5 V, and, in the periods between the voltage applications, a voltage is made off and the circuit is made open.

In FIG. 6a, during the voltage application, the voltage may be made off and the circuit may be made short.

Figure 6B:
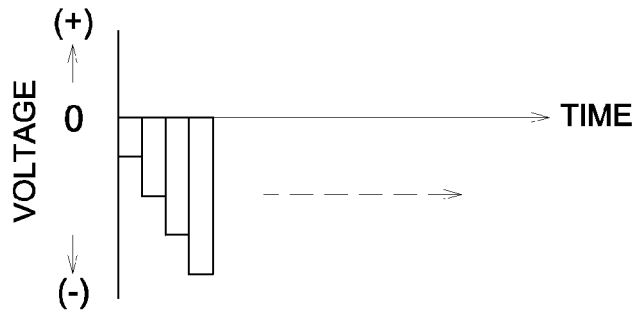

FIG. 6b shows a method for successively applying a voltage in a stepwise fashion.

Figure 6C:
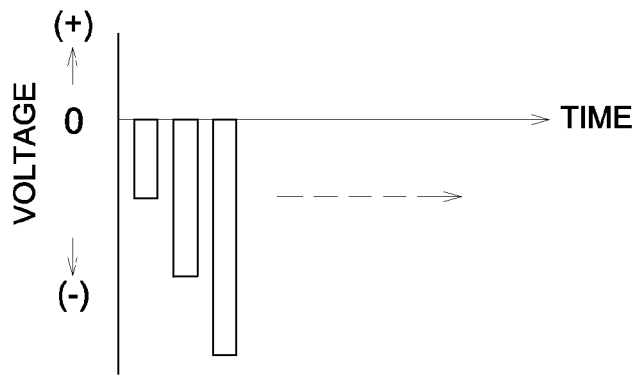

FIG. 6c shows a method for increasing the voltage intervals of application voltage. For example, the interval is not 0.5 V but 1.0 V. This is used under a stable quality condition as described above. Further, the voltage interval may be 0.25 V in the specific voltage range of judgment reference 1, and may be 1.0 V in the other parts. With this, the productivity can be improved by reducing the inspection time.

Figure 6D:
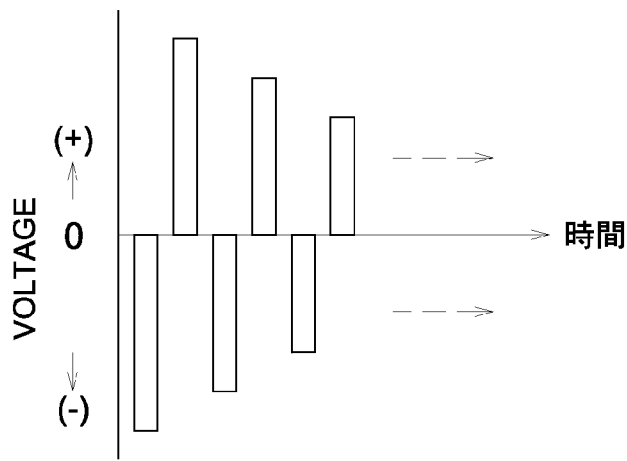

FIG. 6d is a method for applying voltage alternating sequentially between reverse direction and forward direction. This method needs no short between steps, and, since a check of a reverse-direction current and a check of a spike current are carried out alternately, it requires less time and is advantageous to improve manufacturing.

According to the present invention, it becomes possible to accurately select organic EL panel 10 which is highly possible to cause a sudden stop of the light emission by applying a plurality of different step-wise voltages to organic EL panel 10 and carrying out a judgment whether organic EL panel 10 is superior or inferior, based on at least one judgment reference of the above judgment references 1 to 3. Namely, it is possible to carry out efficiently with high-accuracy an inspection whether organic EL panel 10 is superior or inferior.

Figure 7:
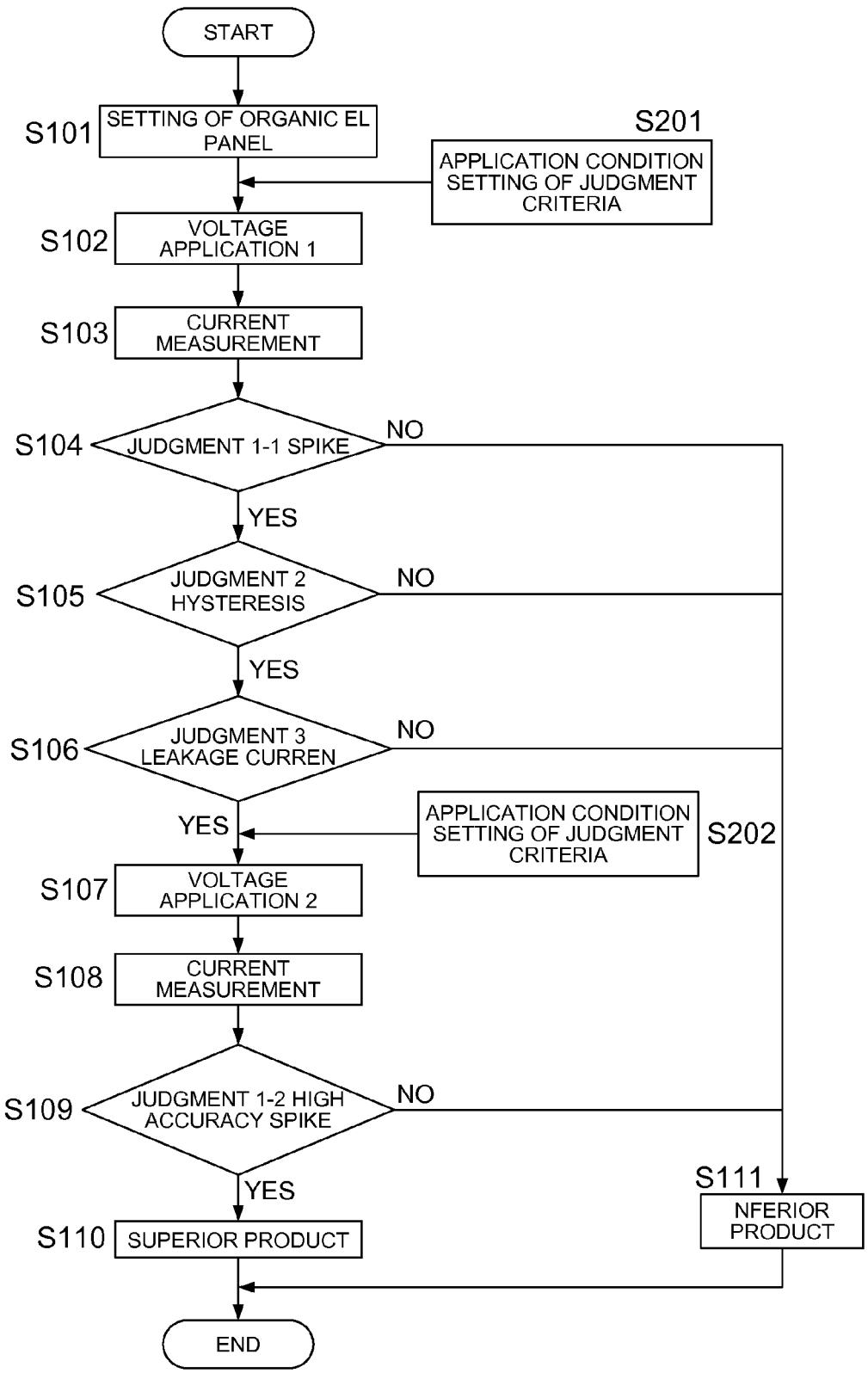
FIG. 7 is a flow diagram of the organic EL panel inspection method relating to the present invention.

FIG. 7 is a flow diagram of the case where an inspection is carried out by using the foregoing judgment references 1-1, 1-2, 2 and 3. The voltage application condition and the judgment criterion (the threshold) in each judgment reference are intended to be set in advance at steps S201 and S202 and are input.

At step S1-1, organic EL panel 10 is set on an inspection bench.

At step S102, by power source section 20 controlled by control section 40, a plurality of preset voltages are successively applied. This voltage is one used in judgment references 1-1, 2 and 3.

At step S103, each current at each applied voltage is measured at current measuring section 30. The measured current is sent to control section 40, and the control section 40 creates, based on the measured data, a relation table between the applied voltage and the measured current (the V-I characteristic table). Also, the V-I characteristic graph is created. These are sent to judging section 50.

At step S104, the V-I characteristic table and the V-I characteristic graph are referred at judgment section 50, and based on the V-I characteristics, the presence or absence of a spike current is judged with judgment reference 1-1, and then, organic EL panel 10 is judged whether it is superior or inferior. If it is judged to be inferior (step S104: No), it is classified into an inferior product at step S111. If it is judged to be superior (step S104: Yes), it goes to step S105.

At step S105, the V-I characteristic table and the V-I characteristic graph are referred at judgment section 50, and based on the V-I characteristics, the difference in the current hysteresis is judged with judgment reference 2, and then, organic EL panel 10 is judged whether it is superior or inferior. If it is judged to be inferior (step S105: No), it is classified into an inferior product at step S111. If it is judged to be superior (step S105: Yes), it goes to step S106.

At step S106, the V-I characteristic table and the V-I characteristic graph are referred at judgment section 50, and based on the V-I characteristics, the absolute value of the current density at the predetermined voltage is judged with judgment reference 3, and then, organic EL panel 10 is judged whether it is superior or inferior. If it is judged to be inferior (step S106: No), it is classified into an inferior product at step S111. If it is judged to be superior (step S106: Yes), it goes to step S107.

At step S107, by power source section 20 controlled by control section 40, a plurality of preset voltages are successively applied. This voltage is one used in judgment references 1-2.

At step S108, each current at each applied voltage is measured at current measuring section 30. The measured current is sent to control section 40, and the control section 40 creates, based on the measured data, a relation table between the applied voltage and the measured current (the V-I characteristic table). Also, the V-I characteristic graph is created. These are sent to judging section 50.

At step S109, the V-I characteristic table and the V-I characteristic graph are referred at judgment section 50, and based on the V-I characteristics, the presence or absence of a spike current is judged with judgment reference 1-2 (a high accuracy spike inspection), and then, organic EL panel 10 is judged whether it is superior or inferior. If it is judged to be inferior (step S109: No), it is classified into an inferior product at step S111. If it is judged to be superior (step S109: Yes), it is classified into a superior product at step S110.

According to the method shown in FIG. 7, the range in which the judgment is made to be superior is widened by enlarging the threshold in judgment reference 1-1. Based on the total of the above judgment and the judgment at the inspection relating to judgment references 2 and 3 to be hereinafter described, the primary sorting of organic EL panel 10 whether it is superior or inferior is carried out, and further, a detailed judgment is carried out in judgment reference 1-2, whereby the secondary sorting is carried out. With the above sorting, judgment references 1-1, 2 and 3 can be carried out in almost parallel fashion, and thereby, a judgment with a higher accuracy can be effectively carried out.

Figure 8:
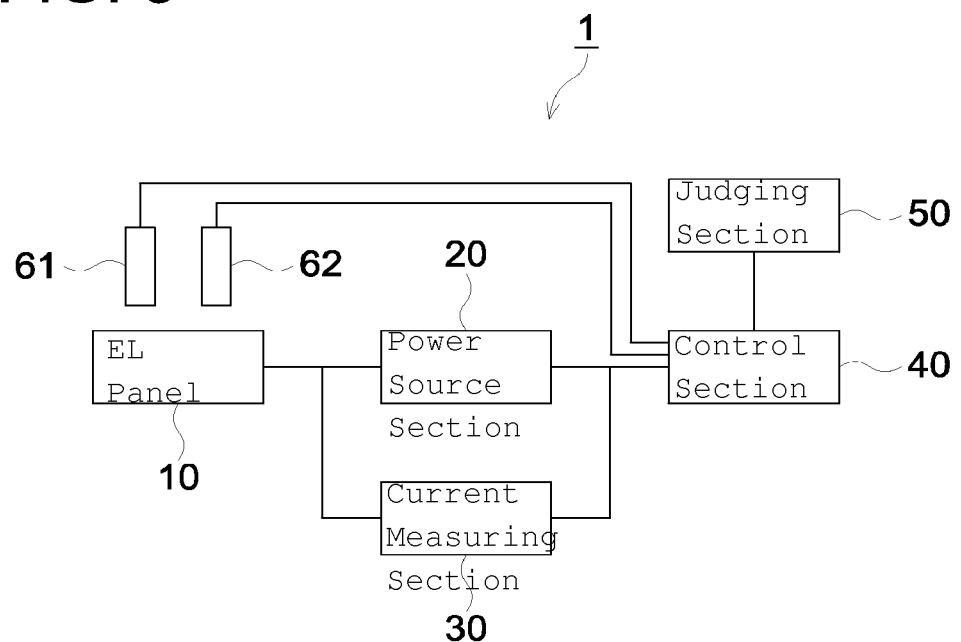
FIG. 8 is an example of the inspection method relating to the present invention combined with an inspection method using optical information.

Further, an inspection method based on optical information may be combined with the above inspection method of the present invention. Though the configuration of the apparatus becomes complex, the time required remains the same, and then, there are advantages such as higher accuracy. An example in which an inspection method based on optical information was combined is shown in FIG. 8. In FIG. 8, numerical numbers 61 and 62 indicate an imaging element such as an imaging sensor, and a light source such as a lighting lamp, respectively.

Image sensor 61 is an element which takes images such as an exterior appearance when no light is up, brightness unevenness when light is emitted at a rated condition, color of light, dark spot, to decide whether they pass or fail. This inspection device is intended to carry out an inspection of the panel which passed the inspection test of the sudden stop of the light emission (the sudden death) which was so far described using image sensor 61 described in this paragraph. With this, a decision to pass or fail of organic EL panel 10 can be effectively carried out.

EXAMPLES

Using the organic EL panel inspection device shown in FIG. 3, inspection on 100 pieces of white organic EL panel for lighting use (hereinafter referred to as organic EL panel 10) was carried out with an inspection using judgment references 1-2, 2 and 3, and then, the organic EL panel inspection method was evaluated.

The specifications of organic EL panel 10 which is the subject of inspection are that the light emitting area is 50 mm×50 mm, the number of light emitting unit is one, light emission is generally initiated at 2.5 to 3 V, and a current of about 25 A/m² flows at 3.6 to 3.8 V.

The inspection with judgment references 1-1, 2 and 3 is referred to as inspection 1, and the inspection with judgment reference 1-2 is referred to as inspection 2. First, the primary sorting of organic EL panel 10 whether it is superior or inferior was carried out with inspection 1, and the secondary sorting was carried out with inspection 2 (a high accuracy spike inspection).

[Inspection 1]

Inspection 1-1: First, after an inspection of the exterior appearance, light emission state was checked. Panels such as a non-light emitting panel caused by a short, a panel in which a bright spot is observed in light emitting area, and a panel in which a dark spot is visually observed were rejected as the primary inferior product.

Inspection 1-2: The inspection of the present invention was carried out on the remained primary superior panels.

Voltages were applied under the inspection conditions described below, and an electric current at each step was measured and recorded.

(Inspection Conditions)

(1) The voltage is applied in a step-wise form, and, between the steps, the voltage application is once turned off to make it open.

(2) The voltage application pattern is at a step of 0.25 V, in the voltage range of −3.5 V to +3.5 V, and in the voltage application sequence of 0→−3.5→0→3.5→0.

(3) The voltage application is repeated three times for the same measurement (4) The power source used for the voltage application and the current measurement is R6243 (manufactured by ADVANTEST Corporation).

Based on the results of the electric current measurement, a temporary judgment whether a panel is superior or inferior was carried out with judgment references 1-1, 2 and 3, whereby each panel was classified into the four types (a) to (d) below.

(a) A temporary inferior panel in which the spike current of 0.001 A/m² or more was observed in at least one place.

(b) A temporary inferior panel in which, in a shape of voltage-current, a shift of 0.001 A/m² or more was observed in the electric current hysteresis formed by back-and-forth of voltage application (c) A temporary inferior panel in which the absolute value of the electric current at an application of −3.5 V was 0.004 A/m² or more (d) A temporary superior panel which does not correspond to (a) to (c)

[Inspection 2]

For the panel which was classified into the temporary superior panel by inspection 1, the inspection below was further carried out.

Voltages were applied under the inspection conditions described below, and an electric current at each step was measured and recorded.

(Inspection Conditions)

(1) The voltage is applied in a step-wise form, and, between the steps, the voltage is continuously applied.

(2) The voltage application pattern is at a step of 0.005 V, in the voltage range of 0 V to −3.5, and in the voltage application sequence of 0→−3.5→0.

(3) The power source used for the voltage application and the current measurement is B1500A Semiconductor Analyzer (manufactured by ADVANTEST Corporation).

Based on the results of the current measurement, a judgment whether a panel is superior or inferior was carried out with judgment reference 1-2, whereby each panel was classified into the two types (d1) and (d2) below.

(d1) A semi-superior panel in which the spike current of 0.0005 A/m² or more was observed in at least one place (d2) A superior panel which does not correspond to (d1)

[Inspection Results]

Results of Inspection 1: The breakdown of the 100 pieces of organic EL panels was 20 pieces in (a), 5 pieces in (b), 10 pieces in (c), and 65 pieces in (d).

Results of Inspection 2: The breakdown of the 65 temporary superior panels in (d) was 20 pieces in (d1), and 45 pieces in (d2).

[Evaluation]

A continuous driving of the above 100 pieces of organic EL panels was carried out at room temperature and at a constant electric current. The driving condition was 25 A/m² (about 1,000 nits), and the light emission was checked every day.

As a result, 7 out of 35 pieces of the temporary inferior panels classified into (a) to (c) showed a sudden stop of the light emission due to a short within 1,000 hours.

In the candidate of the temporary superior panel in (d), 3 out of 65 pieces of panels showed a sudden stop of the light emission due to a short within 1,000 hours. The all 3 pieces of panels which showed the sudden stop of the light emission were the semi-superior panel in (d1).

The results are shown in Table 1.

TABLE 1

|  | Number of panels | Number of panels of sudden stop of light emission within 1,000 hours, | Rate of sudden stop of light emission (%) |
|---|---|---|---|
| Temporary inferior panel in (a) to (c) | 35 | 7 | 20 |
| Temporary superior panel in (d) | 65 | 3 | 4.6 |
| Breakdown of (d)   Semi-superior panel in (d1) | 20 | 3 | 15 |
| Superior panel in (d2) | 45 | 0 | 0 |

As shown in Table 1, it was confirmed that the inspection method of the organic EL panel of the present invention was valid.

DESCRIPTION OF NUMERIC DESIGNATIONS 1. an organic EL panel inspection device
10. an organic EL panel 20. a power source
30. a current measuring section
40. a control section
50. a judging section

The invention claimed is:

1. An organic EL panel inspection method for inspecting whether an organic EL panel provided with an organic EL element is superior or inferior, the method comprising:
   a step of applying a plurality of voltages having different values successively in sequence to the organic EL panel, and measuring each electric current; and
   a step of judging whether the organic EL panel is superior or inferior based on the measured electric currents;
   wherein the step of judging whether the organic EL panel is superior or inferior is carried out based on at least one of a judgment reference 1, a judgment reference 2, and a judgment reference 3;
      wherein the judgment reference 1 represents a presence or absence of a spike-like electric current in the measured currents, the judgment reference 2 represents a presence or absence of generation of electric current having different current density at an identical voltage between when the plurality of voltages are applied successively from one end in the sequence of the plurality of voltages to the other end and when the plurality of voltages are applied successively from the other end to the one end, and the judgment reference 3 represents an absolute value of current density of an electric current flowed when a predetermined voltage is applied to the organic EL panel in a reverse direction.

2. The organic EL panel inspection method described in claim 1, wherein the plurality of voltages changes in stepwise at an interval of voltage of 0.5 volts or less.

3. The organic EL panel inspection method described in claim 1, wherein at least one of the plurality of voltages is a voltage at or near a portion where the electric current rises in a voltage-current characteristic curve in a forward direction of the organic EL panel.

4. The organic EL panel inspection method described in claim 1, wherein a range of the voltages to be applied is represented by an entire or a part of a range of $+n \times E(V)$ to $-n \times E(V)$, wherein a number of a plurality of light emitting units in which a plurality of the organic EL panels is laminated is represented by n units, wherein $E(V)$=light emission initiation voltage of an organic EL panel $(V)+2.0$ $(V)$, and the light emission initiation voltage of the organic EL panel represents a voltage when the number of the light emission unit is one.

5. The organic EL panel inspection method described in claim 1, wherein, in the judgment reference 1, when a magnitude of the current density of the spike-like electric current is less than a predetermined current density, the spike-like electric current is judged to be absent, and thereby the organic EL panel is judged to be superior, and when the magnitude of the current density of the spike-like electric current is more than or equal to the predetermined current density, the spike-like electric current is judged to be present, and thereby the organic EL panel is judged to be inferior.

6. The organic EL panel inspection method described in claim 1, wherein, in the judgment reference 1, when a voltage range of the applied voltage in which the spike-like current is generated is $-E+0.5(V)$ or more and $-1.0$ V or less, or $+1.0$ V or more and $E-0.5$ (V) or less, the organic EL panel is judged to be inferior, wherein $E(V)$=light emission initiation voltage of the organic EL panel $(V)+2.0$ $(V)$.

7. The organic EL panel inspection method described in claim 1, wherein, in the judgment reference 2, when the difference of the current densities at the identical voltage is less than a predetermined value, the organic EL panel is judged to be superior, and when the difference of current densities at the identical voltage is higher than or equal to the predetermined value, the organic EL panel is judged to be inferior.

8. The organic EL panel inspection method described in claim 1, wherein, in the judgment reference 3, when the absolute value of the current density of the electric current is less than a predetermined absolute value, the organic EL panel is judged to be superior, and when the absolute value of the current density of the electric current is higher than or equal to the predetermined absolute value, the organic EL panel is judged to be inferior.

9. The organic EL panel inspection method described in claim 1, wherein a number of repeated applications of the plurality of voltages is three or more.

10. An organic EL panel inspection device which inspects whether an organic EL panel provided with an organic EL element is superior or inferior, the organic EL panel inspection device comprising:
    a voltage application section which applies a plurality of different voltages successively in sequence to the organic EL panel;
    an electric current measuring section which measures each electric current at the plurality of voltages; and
    a judging section which judges whether the organic EL panel is superior or inferior based on the measured electric currents;
    wherein the judgment of whether the organic EL panel is superior or inferior is carried out on at least one of a judgment reference 1, a judgment reference 2, and a judgment reference 3;
    wherein the judgment reference 1 represents a presence or absence of a spike-like electric current in the measured currents, the judgment reference 2 represents a presence or absence of generation of electric current having different current density at an identical voltage between when the plurality of voltages are successively applied from one end in the sequence of the plurality of voltages to the other end and when the plurality of voltages are successively applied from the other end to the one end, and the judgment reference 3 represents an absolute value of a current density of an electric current flowed when a predetermined voltage is applied to the organic EL panel in a reverse direction.

11. The organic EL panel inspection device described in claim 10, wherein the plurality of voltages changes in stepwise at an interval of voltage of 0.5 volts or less.

12. The organic EL panel inspection device described in claim 10, wherein at least one of the plurality of voltages is a voltage at or near a portion where the electric current rises in a voltage-current characteristic curve in a forward direction of the organic EL panel.

13. The organic EL panel inspection device described in claim 10,
    wherein a range of the voltage to be applied is represented by an entire or a part of range of $+n \times E(V)$ to $-n \times E(V)$, wherein a number of plurality of light emitting units in which the organic EL panels are laminated is represented by n units, wherein $E(V)$=light emission initiation voltage of an organic EL panel $(V)+2.0$ $(V)$, and a light emission initiation voltage of the organic EL panel represents a voltage when the number of the light emission units is one.

14. The organic EL panel inspection device described in claim 10, wherein, in the judgment reference 1, when the magnitude of the current density of the spike-like electric current is less than a predetermined current density, the spike-like electric current is judged to be absent, and thereby the organic EL panel is judged to be superior, and when the magnitude of the current density of the above spike-like electric current is more than or equal to the predetermined current density, the spike-like electric current is judged to be present, and thereby the organic EL panel is judged to be inferior.

15. The organic EL panel inspection device described in claim 10, wherein, in the judgment reference 1, when a voltage range of the applied voltage in which the spike-like current is generated is $-E+0.5(V)$ or more and $-1.0$ V or less, or $+0.1$ V or more and $E-0.5$ (V) or less, the organic EL panel is judged to be inferior, wherein $E(V)$=light emission initiation voltage of an organic EL panel $(V)+2.0(V)$.

16. The organic EL panel inspection device described in claim 10, wherein, in the judgment reference 2, when a difference of the current densities at the identical voltage is less than a predetermined value, the organic EL panel is judged to be superior, and when the difference of the current densities at the identical voltage is higher than or equal to the determined value, the organic EL panel is judged to be inferior.

17. The organic EL panel inspection device described in claim 10, wherein, in the judgment reference 3, when the absolute value of the current density of the electric current is less than a predetermined absolute value, the organic EL panel is judged to be superior, and when the absolute value of the current density of the electric current is higher than or equal to the predetermined absolute value, the organic EL panel is judged to be inferior.

18. The organic EL panel inspection device described in claim 10, wherein a number of repeated applications of the plurality of voltages is three or more.

19. The organic EL panel characterized by having been inspected by the organic EL panel inspection method described in claim 1.

* * * * *